(12) United States Patent
Pace et al.

(10) Patent No.: US 6,392,423 B2
(45) Date of Patent: May 21, 2002

(54) METHOD FOR TESTING INTEGRATED CIRCUIT DEVICES

(75) Inventors: Bradley D. Pace; Durbin L. Seidel; William Richard Lawrence, all of Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/814,497

(22) Filed: Mar. 21, 2001

Related U.S. Application Data

(62) Division of application No. 09/033,947, filed on Mar. 2, 1998, now Pat. No. 6,285,200.

(51) Int. Cl.[7] ..................... G01R 31/308; G01R 31/02; G01R 31/00
(52) U.S. Cl. .......................... 324/753; 324/754; 324/96
(58) Field of Search .................. 324/753, 96, 770, 324/501, 754, 537

(56) References Cited

U.S. PATENT DOCUMENTS

| 4,875,006 A | * | 10/1989 | Henley et al. | 324/97 |
| 5,479,106 A | * | 12/1995 | Takahashi et al. | 324/753 |
| 5,999,012 A | * | 12/1999 | Listwan | 324/770 |

* cited by examiner

*Primary Examiner*—N. Le
*Assistant Examiner*—Anjan K. Deb
(74) *Attorney, Agent, or Firm*—Alexander J. Neudeck

(57) ABSTRACT

The present invention is directed to a method and apparatus for testing integrated circuit package devices using automatic testing equipment. The automatic testing equipment may be provided with a light source to enable the testing of image capture type integrated circuit devices. Alternatively, the automatic testing equipment may be provided with an imaging device, e.g., a camera, or both an imaging device and a light source to additionally enable the testing of display type integrated circuit devices.

18 Claims, 10 Drawing Sheets

METHOD FOR TESTING INTEGRATED CIRCUIT DEVICES

CROSS REFERENCE TO RELATED APPLICATIONS

This application is a divisional of U.S. patent application Ser. No. 09/033,947 filed Mar. 2, 1998, now U.S. Pat. No. 6,285,200, which is hereby incorporated by reference for all that is disclosed therein.

FIELD OF THE INVENTION

The present invention relates generally to the testing of integrated circuit devices and, more specifically, to the testing of integrated circuit devices which require optical access to the active surfaces thereof in order to perform proper testing.

BACKGROUND OF THE INVENTION

The manufacture of integrated circuits typically begins with a process in which multiple layers of the integrated circuit are formed via a photolithographic process. Typically, during the photolithographic process, several integrated circuits are manufactured on a single silicon substrate which is commonly referred to in the industry as a "wafer".

A completed integrated circuit includes a number of circuit layers and a plurality of electrical connection sites to facilitate electrical interface between the integrated circuit and the electronic device in which the integrated circuit is eventually installed. When the manufacture of the integrated circuits on a wafer is completed, the wafer is broken apart such that the integrated circuits contained thereon are separated into individual units.

Integrated circuits still located on a wafer, i.e., before the wafer is broken apart as described above, may be referred to herein as "wafer integrated circuits".

After separation, each integrated circuit is typically mounted into an integrated circuit "package". A package is a housing which generally includes a plurality of electrical connectors, e.g., pins, around its periphery. The housing also includes electrical connections between the integrated circuit electrical connection sites and the package pins. In this manner, the package provides an interface between the integrated circuit and the electronic device in which the package is eventually to be installed.

Two types of integrated circuit devices have become increasingly common. An image capture chip is an integrated circuit device which is capable of capturing a two dimensional image, e.g., a page of printed text. Image capture chips generally consist of a one or two-dimensional photosensor array, which may, for example, be an array of photodetectors. Image capture chips are typically used in devices such as camcorders and digital cameras. One example of a commercially available image capture chip is a Model No. VV6850 currently offered for sale by Vision Company at 571 West Lake Avenue, Suite 12, Bay Head, N.J., 08742.

A display chip is an integrated circuit device which includes an array of display pixels which can each be selectively energized to assume various visual conditions, e.g., reflective vs. non-reflective or light emitting vs. non-light emitting. Display chips are typically used in devices such as displays for digital cameras or for cellular telephones. One example of a commercially available display chip is a Model 320C Color "CyberDisplay" currently offered for sale by Kopin Corporation, 695 Myles Standish Blvd., Taunton, Mass. 02780.

It is desirable to test integrated circuit devices at various stages in the development of the devices. It is common, for example, to inspect integrated circuits while the integrated circuits are still part of a wafer (i.e., wafer integrated circuits), as described above. It is also common to test integrated circuit packages after the integrated circuits have been installed into packages. This common procedure of testing at various stages of development allows defective integrated circuit products to be detected early in the manufacturing process.

Testing of integrated circuit devices is commonly accomplished through the use of automated test equipment. In the testing of wafer integrated circuits, as described above, it is common to mount a wafer to be tested within an automated robotic handling device. A test head is then moved into proximity with the handling device. The test head contains a plurality of electrical contact probes which are adapted to make electrical contact with the electrical connection sites of a wafer integrated circuit. The handling device moves the wafer toward the test head until the electrical connection sites of a first integrated circuit come into contact with the contact probes of the test head. In this manner, the test head is able to conduct electrical signals between the integrated circuit electrical connection sites and the appropriate testing equipment in order to accomplish testing of the integrated circuit device in a conventional manner.

After the first wafer integrated circuit has been tested, as described above, the handling device moves the wafer away from the test head, such that the integrated circuit connection sites are no longer in contact with the test head contact probes. The handling device then indexes the wafer so that a second integrated circuit on the wafer is aligned with the test head probes. The process described above is then repeated for the second and for subsequent wafer integrated circuits until all of the integrated circuits on the wafer have been tested.

When testing integrated circuit packages, a package to be tested is typically held within an automated robotic handling device. A test head is fixed in proximity with the handling device. The test head contains a plurality of pin receptors, e.g., socket receptacles, which are adapted to make electrical contact with each of the pins of the package. A plunger in the handling device then urges the integrated circuit package toward the test head until the package pins engage with the test head pin receptors. In this manner, the test head is able to conduct electrical signals between the pins of the integrated circuit package and the appropriate testing equipment in order to accomplish testing of the integrated circuit package in a conventional manner.

After an integrated circuit package has been tested, the handling device then causes another integrated circuit package to move into proximity with the test head. The second integrated circuit package is then tested in a manner as described above. The process is then repeated until the desired number of integrated circuit packages have been tested.

As described above, most integrated circuits and integrated circuit packages can be effectively tested merely by providing electrical interface between the circuit or package and a testing machine. In the case of an image capture chip, however, it is also necessary to provide a light source in order to test the chip. The light source may take the form of a simple light generation device. Alternatively, the light source may include both a simple light generation device and a filter designed to impinge a specific pattern of light onto the active surface of the chip. To test an image capture chip, the light source may be selectively activated while electrical output from the image capture chip is monitored to verify that the image capture chip is generating the proper signals in response to the supplied light and, thus, operating properly.

In order to effectively test a display chip, visual monitoring, e.g., via a camera, of the display chip is required in order to verify that the display chip is generating the proper display dictated by the electrical signals supplied to the display chip. It is desirable for proper testing, for example, that the operation of each display pixel on the display chip be visually verified in order to assure that all of the pixels are operating properly. To facilitate this visual monitoring, a light source may also be required. Some display chips, however, generate light and, thus, may not require a light source.

Current commercially available automatic testing equipment, as generally described above, lacks the provision of either a light source or of a visual inspection system. Accordingly, current automatic testing equipment is incapable of appropriately testing image capture chips and display chips.

Accordingly, it would be desirable to provide an automatic testing system which overcomes the problems described above and which is capable of effectively inspecting image capture and display chip integrated circuit devices.

SUMMARY OF THE INVENTION

The present invention is directed to a method and apparatus for testing integrated circuit package devices using automatic testing equipment. Specifically, the automatic testing equipment may be provided with a light source to enable the testing of image capture type integrated circuit devices. Alternatively, the automatic testing equipment may be provided with an imaging device, e.g., an electronic camera, or both a light source and an imaging device to additionally enable the testing of display type integrated circuit devices.

Integrated circuit packages may be tested using a conventional test head in combination with a modified handling device. The modified handling device may include a plunger to apply pressure to the integrated circuit package being tested in a conventional manner. The plunger, however, may be modified by the addition of a mirror block which allows optical access to the active surface of the integrated circuit package even while pressure is being applied by the plunger. In this manner, a light source and/or an imaging device located within the modified handling device is afforded optical access to the active surface of the integrated circuit package while testing is being accomplished.

Wafer integrated circuits may be tested using a conventional handling device in combination with a modified test head. The modified test head may include a mirror block which allows optical access to the active surface of the wafer integrated circuit while testing is being carried out. In this manner, a light source and/or an imaging device located within the modified test head is afforded optical access to the active surface of the wafer integrated circuit while testing is being accomplished.

DETAILED DESCRIPTION OF THE INVENTION

Figure 1:
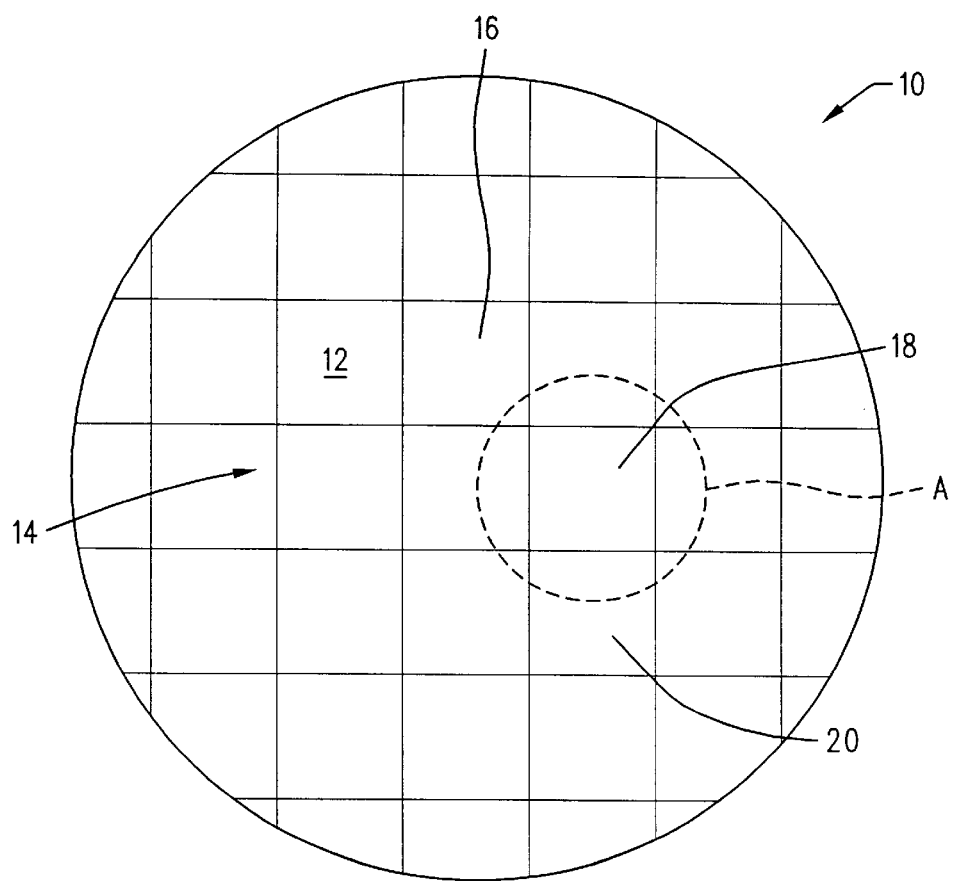
FIG. 1 is a top plan view of a wafer containing a plurality of integrated circuits thereon.

FIGS. 1–14 in general, illustrate an integrated circuit device test system 100, 300 for testing an integrated circuit device 18 of the type having a plurality of electrical contact mechanisms 24, 60 thereon. The system includes a test head 210, 410 including a plurality of electrical contact members 213, 414; a handling apparatus 110, 310 adapted to handle the integrated circuit device 18 and selectively move the integrated circuit device electrical contact mechanisms 24, 60 into and out of contact with the test head electrical contact members 213, 414; and a light source 112, 432 located in illuminating relationship with the integrated circuit device 18 when the integrated circuit device electrical contact mechanisms 24, 60 are in contact with the test head electrical contact members 213, 414.

FIGS. 1–14 also illustrate, in general, a method of testing an integrated circuit device 18 of the type having a plurality of electrical contact mechanisms 24, 60 thereon using an automated testing system 100, 300 which includes a test head 210, 410 having a plurality of electrical contact members 213, 414 and a handling apparatus 110, 310 for selectively moving the integrated circuit device electrical contact mechanisms 24, 60 into and out of contact with the test head contact members 213, 414. The method includes the steps of: providing a light source 112, 432 associated with the automated testing system 100, 300; moving the integrated circuit device electrical contact mechanisms 24, 60 into contact with the test head contact members 213, 414; illuminating the integrated circuit device 18 with the light source 112, 432 while the contact between the integrated circuit device electrical contact mechanisms 24, 60 and the test head contact members 213, 414 is maintained; and performing a test of the integrated circuit device 18 during the step of illuminating.

FIGS. 1–14 also illustrate, in general, an integrated circuit device test system 100, 300 for testing an integrated circuit device 18 of the type having a plurality of electrical contact mechanisms 24, 60 thereon. The system includes a test head 210, 410 including a plurality of electrical contact members 213, 414; a handling apparatus 110, 310 adapted to handle the integrated circuit device 18 and selectively move the integrated circuit device electrical contact mechanisms 24, 60 into and out of contact with the test head electrical contact members 213, 414; and an imaging device 120, 440 located in imaging relationship with the integrated circuit device 18 when the integrated circuit device electrical contact mechanisms 24, 60 are in contact with the test head electrical contact members 213, 414.

FIGS. 1–14 also illustrate, in general, a method of testing an integrated circuit device 18 of the type having a plurality of electrical contact mechanisms 24, 60 thereon using an automated testing system 100, 300 which includes a test head 210, 410 having a plurality of electrical contact members 213, 414 and a handling apparatus 110, 310 for selectively moving the integrated circuit device electrical contact mechanisms 24, 60 into and out of contact with the test head contact members 213, 414. The method includes the steps of: providing an imaging device 120, 440 associated with the automated testing system 100, 300; moving the integrated circuit device electrical contact mechanisms 24, 60 into contact with the test head contact members 213, 414; imaging the integrated circuit device 18 with the imaging device 120, 440 while the contact between the integrated circuit device electrical contact mechanisms 24, 60 and the test head contact members 213, 414 is maintained; and performing a test of the integrated circuit device 18 during the step of imaging.

Having thus described the automated test system in general, the system will now be described in further detail.

FIG. 1 illustrates a conventional integrated circuit wafer 10. The wafer 10 may be formed, for example of a silicon material having an upper planar surface 12 and an oppositely disposed lower planar surface, not shown. A plurality of integrated circuits 14, such as the individual integrated circuits 16, 18 and 20 are formed on the upper surface 12 of the wafer 10, as shown, in a conventional manner.

Figure 2:
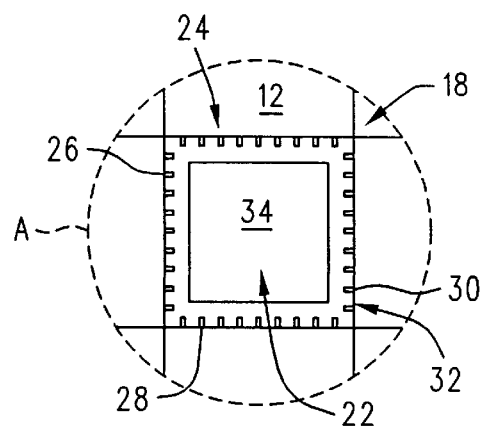
FIG. 2 is a detail view of FIG. 1, Section A and illustrating one of the integrated circuits located on the wafer of FIG. 1

FIG. 2 schematically illustrates, in greater detail, the integrated circuit 18, which is exemplary of all of the integrated circuits 14 formed on the wafer 10. Referring to FIG. 2, the integrated circuit 18 may include a centrally located circuit portion 22 and a plurality of connection sites 24, such as the individual connection sites 26, 28 and 30, located about the periphery 32 of the integrated circuit 18. The connection sites 24 are connected with various portions of the circuit portion 22 and, thus, in a well-known manner, provide an interface between the circuit portion 22 and the electronic device in which the integrated circuit 18 will eventually be installed.

Referring again to FIG. 2, circuit portion 22 includes an exposed active surface 34. If, for example, the integrated circuit device 18 is an image capture chip, as previously described, then the active surface 34 would include a photosensor array, e.g., an array of photodetectors. If the integrated circuit device 18 is a display chip, as also previously described, then the active surface 34 would include an array of display pixels.

Figure 3:
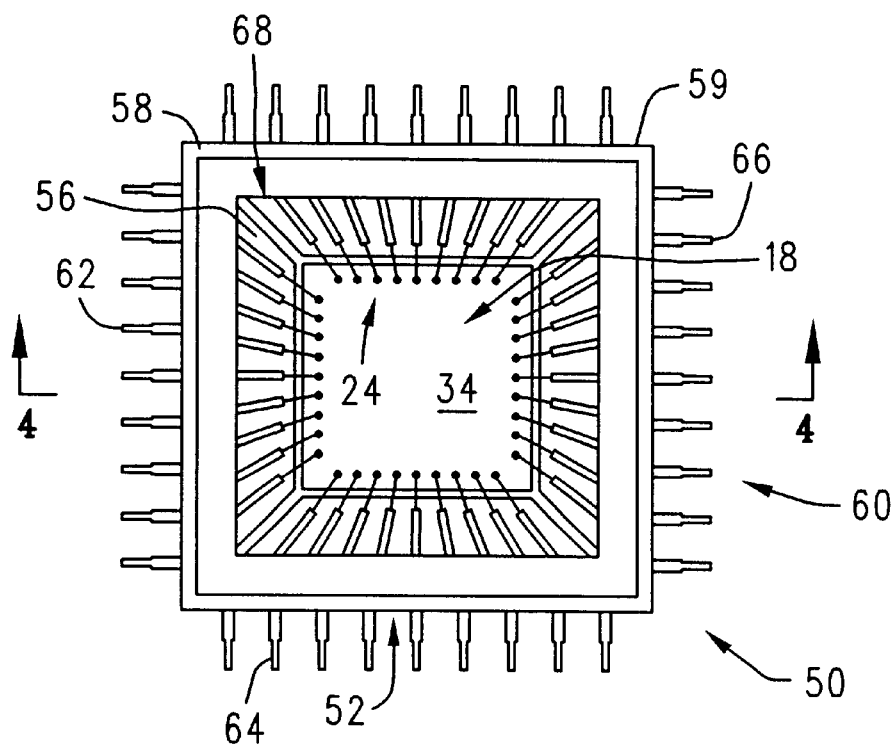
FIG. 3 is a top plan view of an integrated circuit package.
Figure 4:
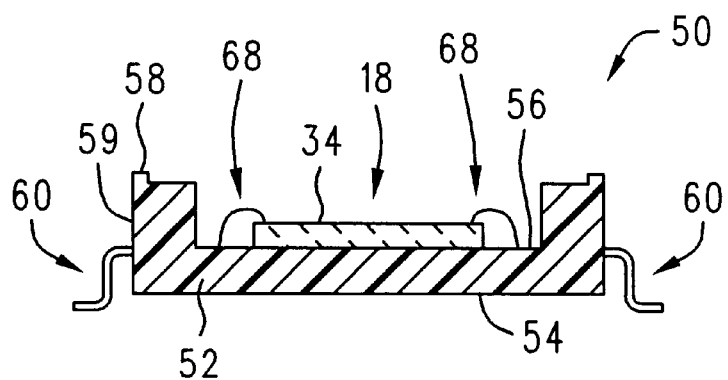
FIG. 4 is a cross-sectional elevation view taken along the line 4—4 of FIG. 3.

FIGS. 3 and 4 illustrate an integrated circuit, such as the integrated circuit 18, mounted within an integrated circuit package 50. Integrated circuit package 50 may be formed from a generally square body portion 52 which may be formed of a plastic material, in a conventional manner. As best shown in FIG. 4, body portion 52 generally includes a planar lower surface 54, a planar upper surface 56 and a raised shoulder portion 58 which extends upwardly from and substantially surrounds the upper surface 56. A plurality of connection pins 60, such as the individual connection pins 62, 64, 66, FIG. 3, extend outwardly and downwardly from the periphery 59 of body portion 52 of the integrated circuit package 50 as shown.

Integrated circuit 18 may be mounted to the upper surface 56 of the integrated circuit package body portion 50 in a well known manner. A plurality of electrical connection leads 68 are provided as shown and serve to connect each of the integrated circuit connection sites 24, FIGS. 2 and 3, with one of the integrated circuit package pins 60. In this manner, each of the integrated circuit connection sites 24 is electrically connected to one of the integrated circuit package pins 60.

Integrated circuit package 50 is adapted to be mounted on a integrated circuit board of an electronic device, in a conventional manner. When so mounted, each of the pins 60 of the package 50 and, thus, each of the connection sites 24 of the integrated circuit 18 will be electrically connected to the integrated circuit board.

In this manner, the package 50 facilitates electrical and physical attachment of the integrated circuit 18 to an integrated circuit board in a well known manner.

As previously described, it is desirable to test integrated circuit devices at various stages of manufacture. It is common, for example, to test integrated circuit devices while they are still mounted on a wafer, such as the wafer 10 described above with respect to FIG. 1. It is also common to test integrated circuit devices after they have been mounted within an integrated circuit package, such as the integrated circuit package 50 described above with reference to FIGS. 3 and 4. Many integrated circuit devices can be effectively tested merely by providing electrical interface between the testing equipment and the integrated circuit device, e.g., the connection sites 24 of the wafer integrated circuit device 18, FIG. 2, or the pins 60 of the integrated circuit package 50, FIGS. 3 and 4.

In the case of an image capture chip, however, it is also necessary to provide a light source in order to test the chip. To effectively test an image capture chip, light from a light source must be selectively impinged upon the active surface 34, e.g., FIGS. 2 and 4, while the chip's electrical output is monitored, via the connection sites 24 or the pins 60, to verify that the image capture chip is generating the proper signals in response to the supplied light.

In order to effectively test a display chip, it is necessary to provide a visual monitoring device, e.g., an electronic camera, in order to verify that the chip is generating the proper display dictated by the electrical signals supplied to the chip. As described previously it is also necessary to provide a light source unless the display chip being tested is the type which generates its own light. To effectively test a display chip, light from a light source, if required, must be impinged upon the active surface 34, e.g., FIGS. 2 and 4. Electrical signals may then be supplied to the chip via the connection sites 24 or the pins 60 while the active surface 34 is monitored by a camera to ensure that the pixels of the display chip are responding in the proper manner to the supplied electrical signals.

Current integrated circuit automatic testing equipment, as previously described, lacks the provision of either a light source or of a visual inspection system. Accordingly, current automatic testing equipment is incapable of effectively testing image capture and display chips. This problem is solved by the provision of improved integrated circuit automatic testing equipment, as will now be described in detail.

Automatic Integrated Circuit Package Testing

Figure 5:
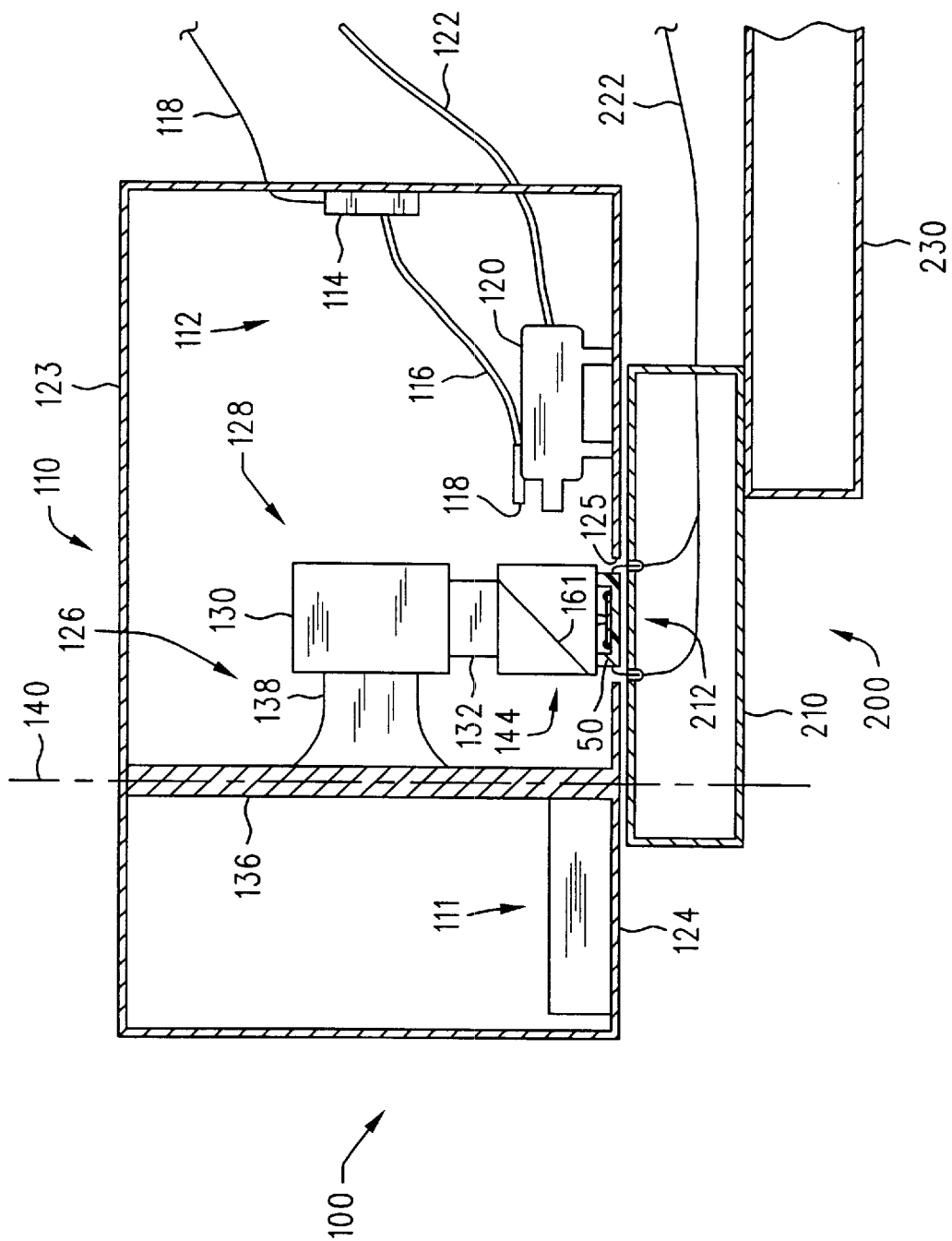
FIG. 5 is an cross-sectional elevation view of an automated integrated circuit package test system taken along the line 5—5 of FIG. 10.

FIG. 5 schematically illustrates a portion of an automated integrated circuit package testing system 100. Package testing system 100 may include a robotic handling machine 110 and a testing machine 200 which is located adjacent the robotic handling machine 110 when testing of integrated circuit packages, such as the integrated circuit package 50 previously described with respect to FIGS. 3 and 4, is being carried out.

Testing machine 200 may include a conventional test head 210 which is attached in an articulated manner to an arm 230. Test head 210 may include a socket device 212 which includes a plurality of pin receptors. The pin receptors may, for example, be in the form of sockets 213, such as the individual sockets 214, 216, FIG. 6. The sockets 213 are adapted to receive pins, such as the pins 60, of an integrated circuit package 50. The socket device 212 may include a number of sockets 213 which corresponds to the number of pins 60 of the integrated circuit package 50 to be tested such that each of the pins 60 will be received within an individual socket of the socket device 212.

Figure 6:
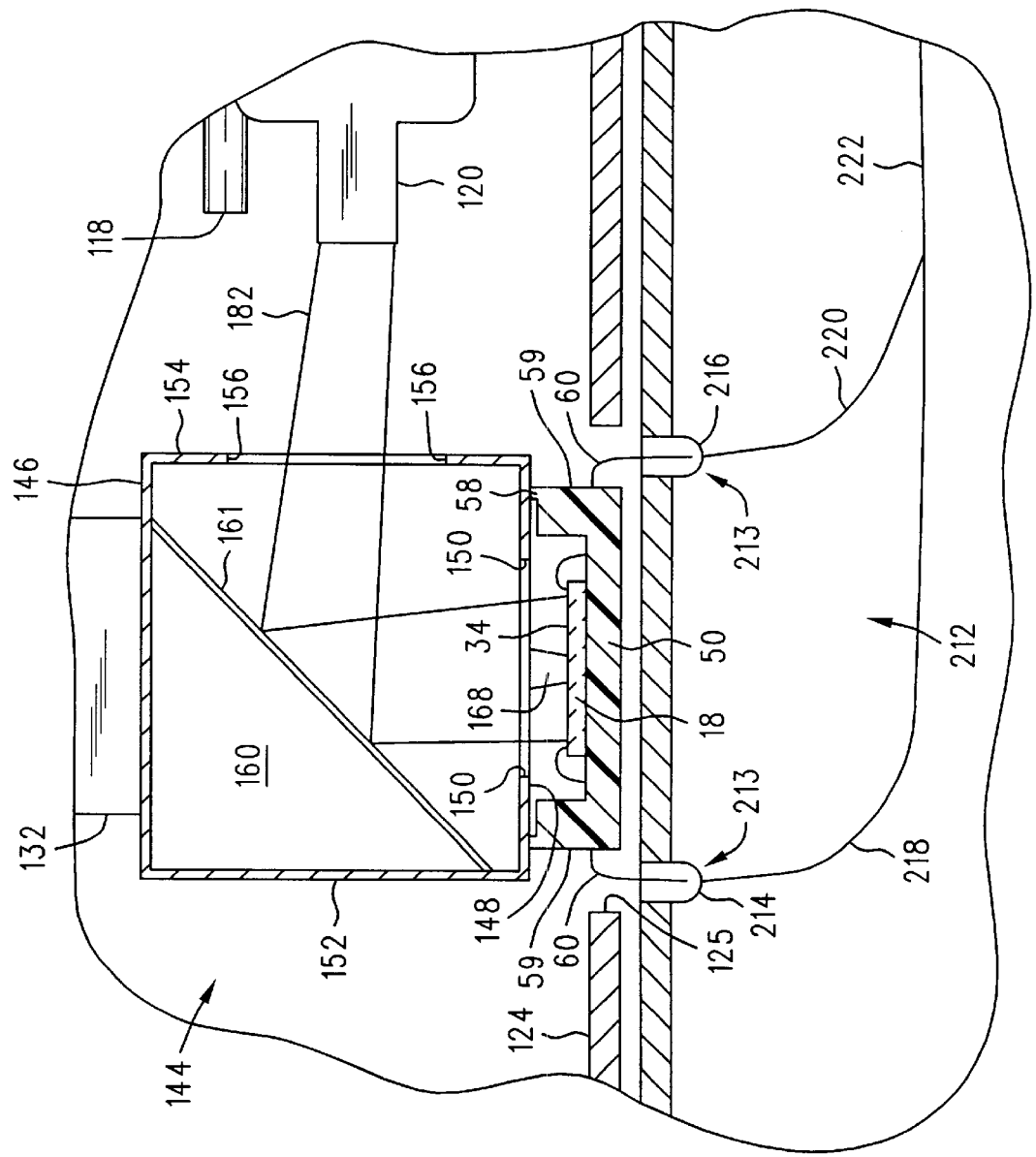
FIG. 6 is a detail view of a portion of the automated integrated circuit package test system of FIG. 5.

With continued reference to FIG. 6, each of the sockets 213 may be attached to an electrical lead, such as the electrical leads 218, 220, respectively. Electrical leads from each of the sockets 213 in the socket device 212 may be bundled into a cable 222 which may, in turn, be connected to a testing machine controller 250 as illustrated schematically in FIG. 11. As can be appreciated, the arrangement described above allows each of the pins 60 of an integrated circuit package 50 to be connected to the testing machine controller 250 and, thus, allows the testing machine controller 250 to test the operation of the integrated circuit package 50 in a conventional manner. Testing machine 200 may be any conventional type of testing machine and may, for example, be of the types commercially available from Hewlett-Packard Company of Palo Alto, Calif. and sold as Tester Model No. HP83000 and Tester Model No. HP94000.

Referring again to FIG. 5, the package testing system 100 may further include a robotic handling device 110, as shown. An opening 125 may be provided in the lower wall 124 of the robotic handling device 110. As can be seen from FIGS. 5 and 6, the opening 125 is located adjacent the socket device 212 of the test head 210, thus allowing access between the interior of the handling device 110 and the test head socket device 212. Handling device 110 may be provided in order to automatically insert a plurality of integrated circuit packages into the socket 212 of the testing machine 200 as will be explained in further detail herein. In this manner, a plurality of integrated circuit packages may be tested automatically, without the need for manual human intervention.

Figure 9:
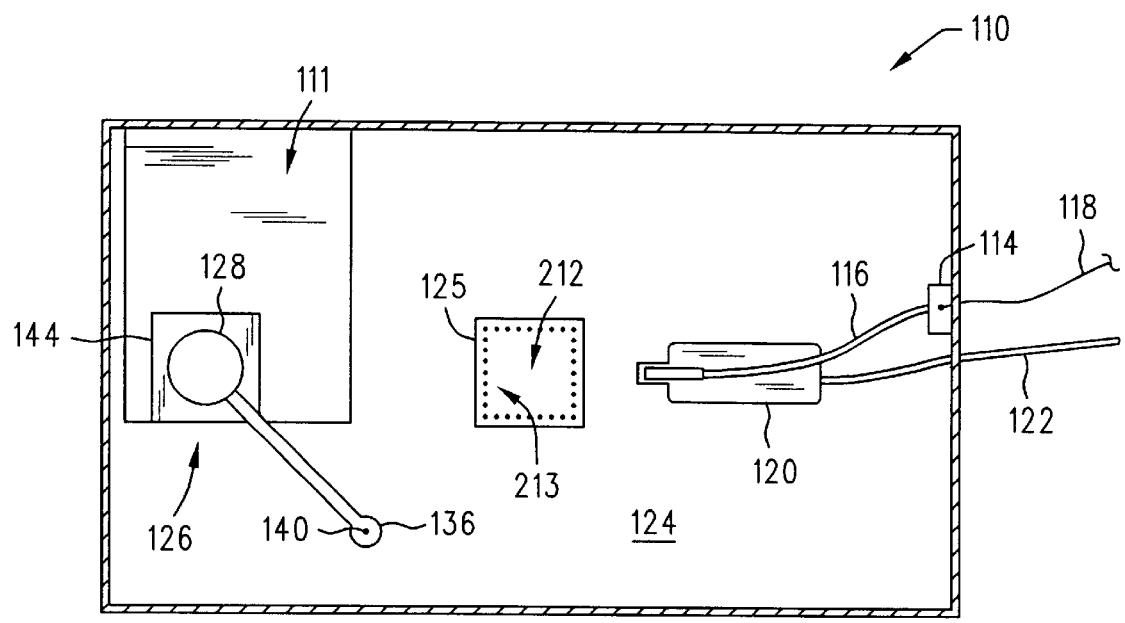
FIG. 9 is a top plan view of a first configuration of the automated integrated circuit package test system of FIGS. 5 and 6 with the top wall of the handling device removed.
Figure 10:
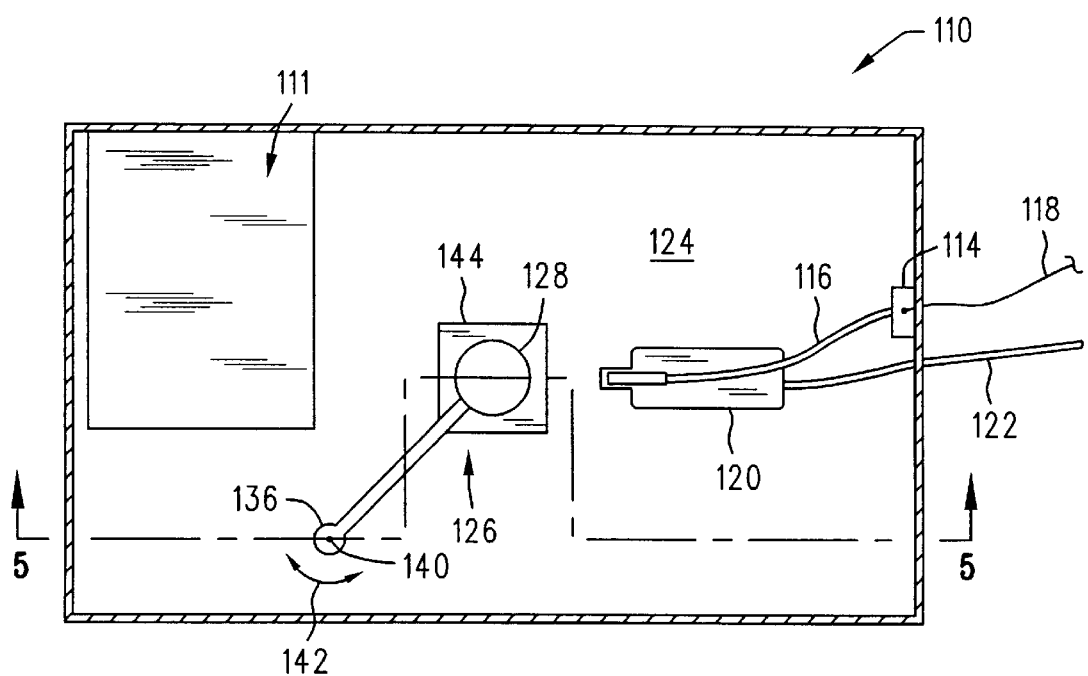
FIG. 10 is a top plan view of a second configuration of the automated integrated circuit package test system of FIGS. 5 and 6 with the top wall of the handling device removed.

Conventional robotic handling devices typically include a conveying device, such as the conveying device 111 schematically illustrated in FIGS. 5, 9 and 10. The conveying device 111 serves to move integrated circuit packages into the robotic handling device 110 for testing and out of the handling device 110 after testing is completed. Conventional robotic handling devices also typically include a movement mechanism which is adapted to move integrated circuit packages between the conveying device 111 and a socket, such as the socket 212, of the testing machine 200. Once an integrated circuit package is located over the socket 212, the movement mechanism or, in some cases, a separate plunger mechanism, applies downward pressure on the integrated circuit package, causing the pins, such as the pins 60, FIG. 6, of the package to enter the sockets of the socket device in order to facilitate testing of the integrated circuit package in a manner as previously described. After testing is completed, the movement mechanism removes the integrated circuit package from the socket and returns it to the conveying device. The process is then repeated until testing of the desired number of integrated circuit packages has been completed.

Although automated integrated circuit package testing systems are generally well-known, such prior systems do not allow for proper testing of integrated circuit packages incorporating image capture and display type integrated circuit devices, as previously described. In order to facilitate testing of such image capture and display type integrated circuit packages, the integrated circuit package testing system 100 has been improved in a manner as will now be explained in detail.

As previously described, the testing machine 200 may be a conventional testing machine. The robotic handling device 110, however, has been modified to include a light source 112 as shown in FIGS. 5 and 6. Light source 112 may take the form of a simple light generation device. Alternatively, light source 112 may include both a simple light generation device and a filter designed to impinge a specific pattern of light onto the active surface of the chip in a conventional manner.

Light source 112 may, for example, include a light generating mechanism 114. Power may be selectively supplied to the light generating mechanism 114 via a power cable 118 which is attached to the light generating mechanism 114. A fiber optic cable 116 may also be attached to the light generating mechanism 114. Light source 112 may be provided in order to impinge light upon the active surface of an image capture type integrated circuit package, e.g., the active surface 34 of integrated circuit package 50, FIGS. 4 and 6. In this manner, the automatic package testing system can effectively test an image capture chip integrated circuit package, in a manner as previously described, i.e., by activating the light source 112 and then monitoring the electrical signals generated by the integrated circuit package via the cable 222 to determine whether the integrated circuit package is generating the proper electrical signals in response to the supplied light.

Referring again to FIGS. 5 and 6, the handling device 110 may be further modified to include a camera 120 as shown. Camera 120 may, for example, be an electronic camera. Camera 120 may be connected, via a conventional cable 122 to the testing machine controller 250, FIG. 11. Testing machine controller 250 may be an integral part of the testing machine 200. Alternatively, testing machine controller 250 may be a separate controller in a conventional manner.

Camera 120 may be provided in order to effectively inspect display type integrated circuit devices, as previously described. Specifically, camera 120 may be provided in order to capture an image of the active surface of a display type integrated circuit package, e.g., the active surface 34 of the integrated circuit package 50, FIGS. 4 and 6. In this manner, the automatic package testing system 100 can effectively test a display chip integrated circuit package in a manner as previously described, i.e., by activating the light source 112 (if necessary), selectively activating portions of the integrated circuit's display via the cable 222 and analyzing the image of the display surface 34 captured by the camera to determine whether the integrated circuit package 50 is generating the proper display image in response to the electrical signals supplied to it via the cable 222.

As can be appreciated from the above, when testing display type integrated circuit devices, it is necessary to provide a camera 120 and, in some cases, a light source 112. When inspecting image capture type integrated circuit devices, however, it is only necessary to provide light source 112.

As described previously, a conventional robotic handling device typically includes a movement mechanism which is adapted to move integrated circuit packages between a conveying device, such as the conveying device 111, and a test socket, such as the test socket 212, of the testing machine. It has been discovered, however, that such conventional movement mechanisms interfere with the ability of the light source 112 to impinge light upon the integrated circuit device and with the ability of the camera 120 to image the integrated circuit device during testing. Specifically, conventional movement mechanisms typically include a plunger mechanism which applies downward pressure on the integrated circuit package while testing of the package is being carried out. Such downward pressure is necessary in order to hold the package securely within the test socket while testing takes place. Typical plunger mechanisms apply this downward pressure by directly contacting the active surface 34 of the integrated circuit device. As can be appreciated, this contact between the plunger and the active surface 34 of the integrated circuit device obstructs the active surface 34. When testing most types of integrated circuits (i.e. other than the image capture type and display type previously described), such obstruction generally does not present a problem. As described previously, however, in order to effectively test display type and image capture type integrated circuits, the active surface 34 of the circuit devices must remain unobstructed. For this reason, prior automatic testing systems are unable to test image capture and display type integrated circuit devices.

To remedy this problem, the robotic handling device 110 may be provided with an improved movement mechanism 126, as will now be described in detail. Referring to FIGS. 5, 9 and 10, movement mechanism 126 may include a plunger 128 which may be attached to a pivot bar 136 via a flange 138. Pivot bar 136 may be rotatably attached to both the upper and lower walls 123, 124 of the handling device 110, as shown in FIG. 5, and may be rotatable about the axis 140 in the directions indicated by the arrow 142, FIG. 10.

Plunger 128 may, for example, be a conventional pneumatic cylinder comprising an upper stationary portion 130 and a lower extensible portion 132 which is received within and movable with respect to the upper portion 130 in a conventional manner. A mirror block 144 may be attached to the plunger lower portion 132 as shown.

Figure 7:
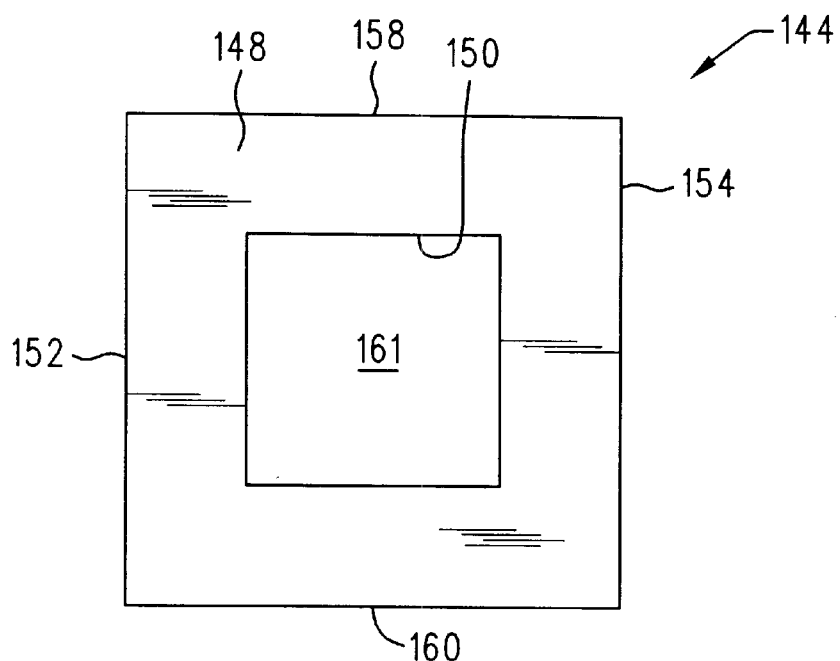
FIG. 7 is a bottom plan view of a mirror block used in conjunction with the automated integrated circuit package test system of FIGS. 5 and 6.
Figure 8:
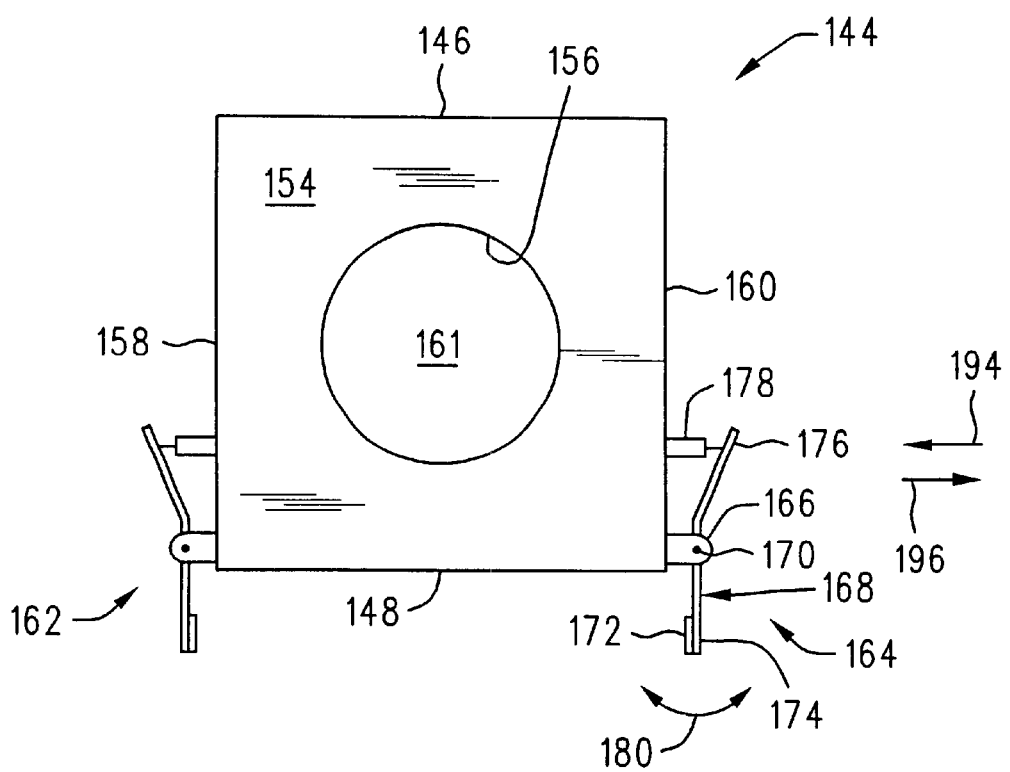
FIG. 8 is a front elevation view of the mirror block of FIG. 7.

Referring to FIG. 6, mirror block 144 may be a hollow, generally parallelepiped-shaped structure having a top wall 146, a bottom wall 148, a rear wall 152, a front wall 154 and oppositely disposed first and second sidewalls 158, 160, FIGS. 7 and 8. Referring to FIG. 7, bottom wall 148 may include an opening 150 therein which may, for example, be square-shaped as shown. Opening 150 may be sized such that it is large enough to completely expose the active surface 34 of integrated circuit device 18 and yet small enough to allow contact between the remaining bottom wall 148 and the integrated circuit package shoulder portion 58 as shown in FIG. 6. Referring to FIG. 8, front wall 154 may include an opening 156 therein which may, for example, be circular as shown.

A reflective surface 161 may be located within the mirror block 144 and may extend between the rear wall 152 and the upper wall 146 as shown in FIG. 6. Reflective surface 161 may extend at an angle of about 45 degrees with respect to both the upper wall 146 and the rear wall 152. Reflective surface 161 may, for example, be formed as a mirror or as a prism in a conventional manner.

Referring again to FIG. 8, a pair of gripper mechanisms 162, 164 may be attached to the sides 158, 160, respectively, of the mirror block 144. Gripper mechanisms 162 and 164 may be substantially identical; accordingly, only the gripper mechanism 164 will be described in detail. Gripper mechanism 164 may include a bracket 166 attached to the mirror block sidewall 160. A lever member 168 may be pivotally attached to the bracket 166 at a pivot axis 170. A resilient pad 172 formed, e.g., of a rubber material, may be attached to the lower end 174 of the lever 168. The opposite end 176 of the lever 168 may be attached to a linear actuator device 178 which may, for example, be a pneumatic cylinder. As can be appreciated from an examination of FIG. 8, actuation of the linear actuator device 178 will cause the lever 168 to pivot about the pivot axis 170 and, thus, cause the lower end 174 of the lever 168 to move in the directions shown by the arrow 180. This movement, in turn, causes the pad 172 to move between the retracted position illustrated in FIG. 8 and an extended position, not shown. Specifically, extension of the actuator device 178 will cause the pad 172 to move in the direction 194 toward the extended position. Retraction of the actuator device 178, on the other hand, will cause the pad 172 to move in the direction 196 toward the retracted position.

The operation of the movement mechanism 126 will now be explained with respect to FIGS. 9 and 10. Referring first to FIG. 9, in order to test an integrated circuit package, the plunger 128 and attached mirror block 144 may be located above the conveying device 111 as shown. The plunger may then be extended such that the plunger lower extensible portion 132, FIGS. 5 and 6, and the attached mirror block lower into contact with an integrated circuit package located on the conveying device 111. As previously described, this contact will occur between the integrated circuit package shoulder portion 58 and the mirror block bottom wall 148 causes the mirror block bottom wall opening 150 to be located above the integrated circuit package active surface 34.

After contact has occurred, the mirror block gripper mechanisms 162, 164, FIG. 8, may then be extended, thus causing the gripper pads 172 to contact the integrated circuit package periphery 59, e.g., FIG. 6, and, thus, hold the integrated circuit package in place against the mirror block bottom wall 148. Next, the plunger 128 may be retracted, thus lifting the integrated circuit package off of the conveying device 111. After lifting, the movement mechanism 126 may be rotated about the axis 140 to the position illustrated in FIG. 10. Movement mechanism 126 may be rotated using any conventional actuator mechanism, such as a rotary actuator mechanism.

After the plunger 128, the mirror block 144 and the attached integrated circuit package are located over the lower wall opening 125 and test socket 212, as illustrated in FIG. 10, the plunger 128 may be extended, thus causing the pins 60 of the integrated circuit package 50 to move downwardly into the sockets, e.g., the sockets 214, 216 of the socket device 212, as shown in FIG. 6. Testing of the integrated circuit package 50 may then be accomplished, in a manner as previously described, while the plunger 128 maintains downward pressure, through the mirror block 144, on the integrated circuit package 50, thus maintaining reliable electrical contact between the integrated circuit package pins 60 and the sockets 213 of the socket device 212.

After testing is completed, the plunger 128 may be retracted and the movement mechanism returned to the position illustrated in FIG. 9. The tested integrated circuit package may then be returned to the conveying device 111 and the process repeated for a new integrated circuit package to be tested.

As can be appreciated, with reference to FIG. 6, the mirror block 144 allows the camera 120 to view the integrated circuit package active surface 34 via the mirror block front wall opening 156, the reflective surface 161 and the bottom wall opening 150. In a similar manner, light emitted from the end 118 of fiber optic cable 116 is also able to impinge upon the active surface 34.

As can be appreciated from the above, provision of the mirror block 144 allows a line of sight 182 to be maintained between the camera 120 and light source 118 and the active surface 34 of an integrated circuit package 50 even while downward pressure is maintained on the integrated circuit package 50 by the plunger 128. Accordingly, the mechanism described above overcomes the prior art problems described above and allows testing of image capture and display type integrated circuit packages by an automated integrated circuit package testing system 100.

It is noted that, as an alternative to the pivoting movement mechanism 126 described above, the plunger 128 may alternatively be slidingly mounted on a slide bar which extends in a horizontal direction within the handling device 110. In this manner, the plunger 128 would be permitted to move horizontally between a position above the socket 212 and a position above the conveying device 111. Such horizontal slide bars are conventionally existing features in some robotic handling devices and, thus, may readily be used to movingly mount the plunger 128.

It is noted that, in the above description, the grippers 162, 164 are set forth by way of example only. Any conventional mechanism may alternatively be used to selectively secure an integrated circuit package to the mirror block bottom wall 148 and, thus, allow the integrated circuit device to be transported between the conveying device 111 and the test socket 212 by the movement mechanism 126. One example of such an alternative conventional mechanism is a suction device which might, for example, contact and supply suction to the integrated circuit package shoulder portion 58 or the peripheral portion 59, e.g., FIG. 6.

As a further alternative, a separate movement mechanism may be provided in order to transfer integrated circuit packages between the conveying device 111 and the test socket 212. Such a separate movement mechanism may, for example, be a conventional suction type integrated circuit package movement device, as is commonly used in many conventional robotic handling devices. The improved movement mechanism 126 described herein may then be used only to supply downward pressure to the integrated circuit package during testing.

Figure 11:
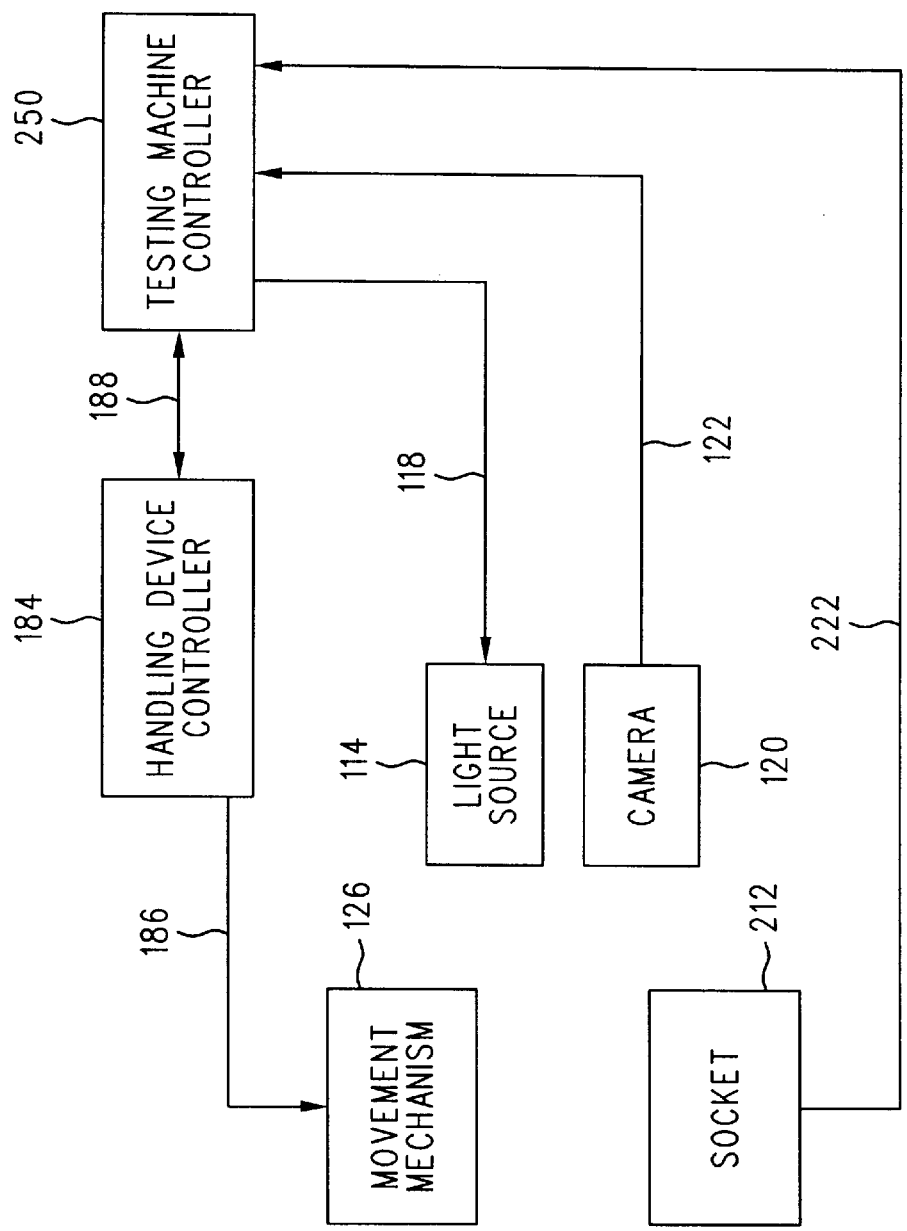
FIG. 11 is a schematic diagram illustrating the operation of the automated integrated circuit package test system of FIGS. 5 and 6.

FIG. 11 schematically illustrates the control system for the modified package testing system 100. Referring to FIG. 11, a handling device controller 184 may be connected via a data link 188 to a conventional testing machine controller 250. Testing machine controller 250 may receive a data signal from the camera 120 via the cable 122 previously described. Testing machine controller 250 may also receive data signals from the socket 212 via the cable 222 previously described. The testing machine controller 250 may also be connected to the light source 114 via the cable 118 previously described. The handling device controller 184 may be connected to the movement mechanism 126 via a cable 186 as shown.

In this manner, the handling device controller 184 is able to control the movement mechanism to cause movement of integrated circuit packages between the conveying device 111 and the test socket 212 in a manner as previously described. The handling device controller 184 is also able to advise the testing machine controller 250, via the data link 188, when an integrated circuit package has been inserted into the test socket 212 SO that the testing machine controller 250 can initiate a test.

The testing machine controller 250 is then able to test image capture chips by selectively activating the light source 118 while monitoring the signals from the socket 212 via the cable 222. The testing machine controller 250 is also able to test display chips by activating light source 114, selectively supplying signals to the socket 212 via the connection 222 and monitoring the image of the integrated circuit package active surface 34 captured by the camera 120 via the cable 122.

Except for the addition of camera 120, light source 112, the improved movement mechanism 126 and the control scenario depicted in FIG. 11, the robotic handling device 110 may be identical to a conventional robotic handling device, such as the type commercially available from Standon Engineering PTE, Ltd. of Singapore and sold as Model 1211 or of the type commercially available from Kanematsu, U.S.A., Inc. of Santa Clara, Calif. and sold as Model HM3500.

It is noted that, although the automated integrated circuit package testing system has been described in conjunction with an integrated circuit package 50 having pins 60, the testing system could readily be used to test any alternative type of integrated circuit package, e.g., an integrated circuit package having electrical connection mechanisms other than pins.

Automatic Wafer Integrated Circuit Testing

Figure 12:
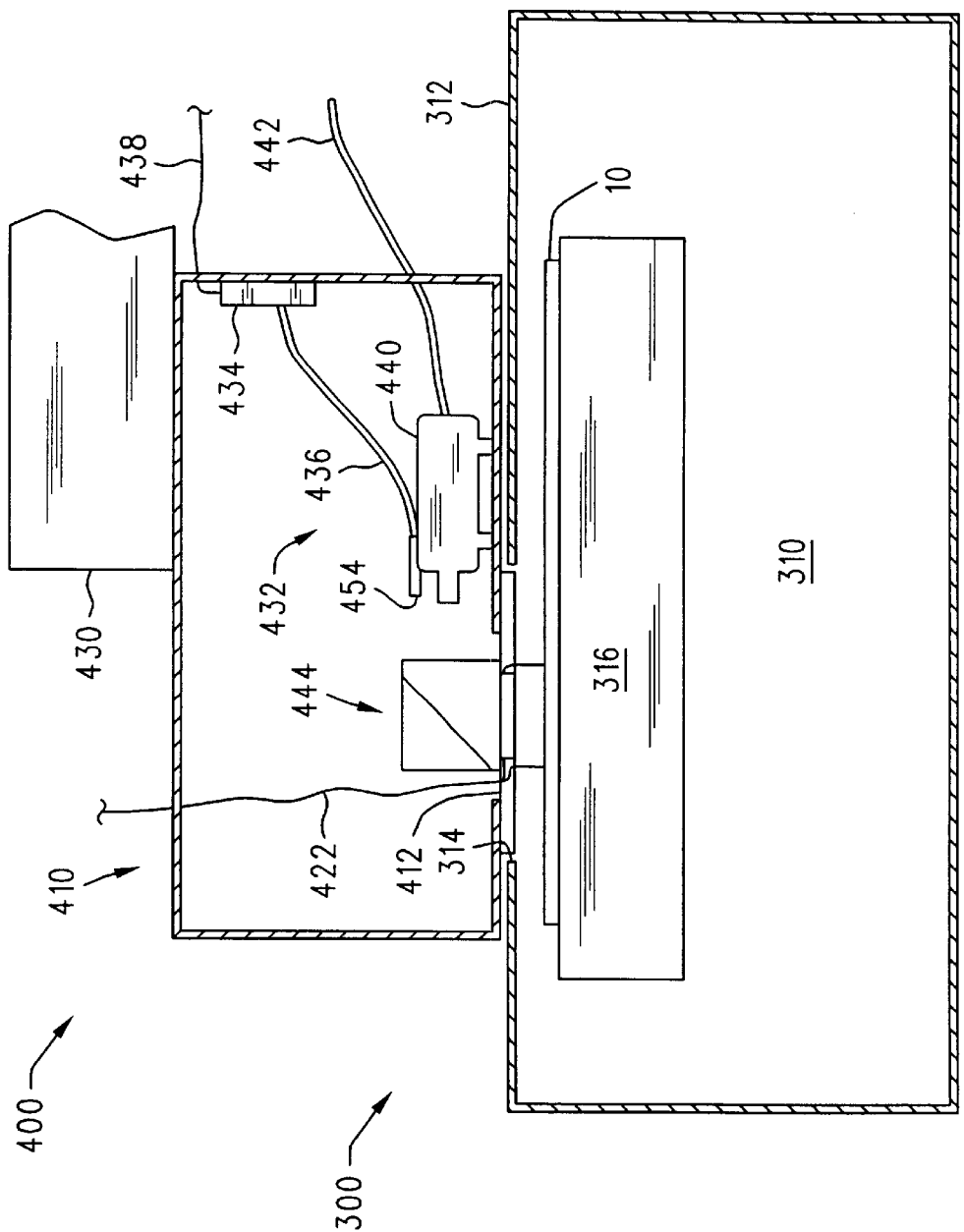
FIG. 12 is a cross-sectional elevation view of an automated wafer integrated circuit test system.

FIG. 12 schematically illustrates a portion of an automated wafer integrated circuit testing system 300. Wafer integrated circuit testing system 300 may include a robotic handling machine 310 and a testing machine 400 which is located adjacent the robotic handling machine 310 when testing of wafer integrated circuits, such as the wafer integrated circuit 18 previously described with respect to FIGS. 1 and 2, is being carried out.

Robotic handling machine 310 may be a conventional robotic wafer handling machine and may include a housing 312 having an opening 314 in an upper wall thereof. Located within the housing 312 is a conventional mechanism 316 for handling wafers, such as the wafer 10 illustrated in FIG. 12. Specifically, the mechanism 316 serves to move a wafer beneath the test head 410 and then to index the wafer such that each circuit on the wafer can be individually tested, via the opening 314, by the test head 410. Handling machine 310 may be any conventional type of handling machine and may, for example, be of the type commercially available from Electroglas, Inc. of Santa Clara, Calif. and sold as Model 4090.

Testing machine 400 may include a test head 410 which is attached in an articulated manner to an arm 430. Test head 410 may include a product board 412 which includes a plurality of socket probes 414, such as the individual probes 416, 418, FIG. 13. The probes 414 of the product board 412 are adapted to contact the connection sites, such as the connection sites 24 of the integrated circuit 18, FIG. 2. The product board 412 may include a number of probes 414 which corresponds to the number of connection sites 24 of the integrated circuit 18 to be tested such that each of the connection sites 24 will be contacted by an individual probe of the product board 412.

Figure 13:
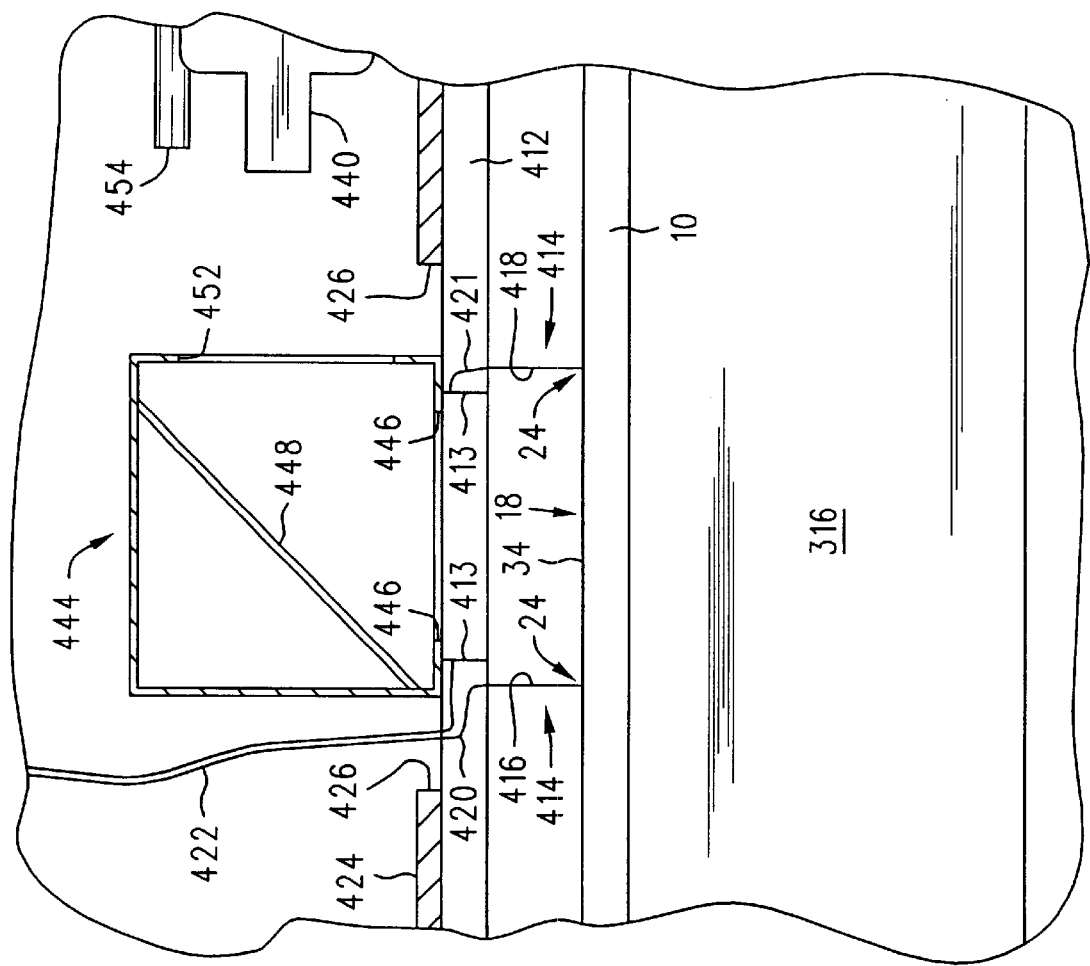
FIG. 13 is a detail view of a portion of the automated wafer integrated circuit test system of FIG. 12.

With continued reference to FIG. 13, each of the probes 414 may be attached to an electrical lead, such as the electrical leads 420, 421. Electrical leads from each of the probes 414 in the product board 412 may be bundled into a cable 422 which may, in turn, be connected to a testing machine controller 450 as illustrated schematically in FIG. 14. Testing machine controller 450 may be an integral part of the testing machine 400. Alternatively, testing machine controller 450 may be a separate controller in a conventional manner.

As can be appreciated, the arrangement described above allows each of the connection sites 24 of an integrated circuit 18 to be connected to the testing machine controller 450 and, thus, allows the testing machine controller 450 to test the operation of each integrated circuit on the wafer 10 in a conventional manner.

Although automated wafer integrated circuit testing systems are generally well-known, such prior systems do not allow for proper testing of integrated circuits incorporating image capture and display type integrated circuit devices, as previously described. In order to facilitate the testing of wafer image capture and display type integrated circuits, the wafer integrated circuit testing system 300 has been improved in a manner as will now be explained in detail.

As previously described, the handling machine 310 may be a conventional handling machine. The testing machine test head 410, however, has been modified to include a light source 432 as shown in FIG. 12. Light source 432 may take the form of a simple light generation device. Alternatively, light source 432 may include both a simple light generation device and a filter designed to impinge a specific pattern of light onto the active surface of the chip in a conventional manner.

Light source 432 may, for example, include a light generating mechanism 434. Power may be selectively supplied to the light generating mechanism 434 via a power cable 438 which is attached to the light generating mechanism 434. A fiber optic cable 436 may also be attached to the light generating mechanism 434. Light source 432 may be provided in order to impinge light upon the active surface of an image capture type integrated circuit, e.g., the active surface 34 of integrated circuit 18, FIG. 2. In this manner, the automatic wafer integrated circuit testing system 300 can effectively test a wafer image capture chip, in a manner as previously described, i.e., by activating the light source 432 and then monitoring the electrical signals generated by the integrated circuit 18 via the cable 422 to determine whether the integrated circuit 18 is generating the proper electrical signals in response to the supplied light.

Referring again to FIG. 12, the test head 410 may be further modified to include a camera 440 as shown. In a similar manner to the camera 120 previously described, the camera 440 may be an electronic camera. Camera 440 may be connected, via a conventional cable 442 to testing machine controller 450, FIG. 14. Camera 440 may be provided in order to effectively inspect display type integrated circuits, as previously described. Specifically, camera 440 may be provided in order to capture an image of the active surface of a display type integrated circuit, e.g., the active surface 34 of the integrated circuit 18, FIG. 2. In this manner, the automatic wafer integrated circuit testing system 300 can effectively test a display chip integrated circuit in a manner as previously described, i.e., by activating the light source 432 (if necessary), selectively activating portions of the integrated circuit's display via the cable 422 and analyzing the image of the display surface 34 captured by the camera 440 to determine whether the integrated circuit 18 is generating the proper display image in response to the electrical signals supplied to it via the cable 422.

As can be appreciated from the above, when testing display type integrated circuits, it is generally necessary to provide a camera 440 and, in some cases, a light source 432. When inspecting image capture type integrated circuits, however, it is only necessary to provide light source 432.

In order to provide visual access to the active surface 34 of an integrated circuit 18, an opening 426 may be provided in the lower wall 424 of the testing machine 400. An opening 413 may also be provided in the product board 412 and may be aligned with the opening 426 as shown in FIG. 13.

A mirror block 444 may be mounted to the product board 412 as shown. Mirror block 444 may be identical to the mirror block 144 previously described with respect to FIGS. 5 and 6 and may, for example include a lower opening 446 which is aligned with the openings 413 and 426 in the product board 412 and the lower wall 424 as shown. Mirror block 444 may also include a front opening 452 and a reflective surface 448 similar to the front opening 156 and reflective surface 161 previously described with respect to the mirror block 144, FIG. 6.

As can be appreciated, with reference to FIG. 13, the mirror block 444 allows the camera 440 to view the integrated circuit active surface 34 via the mirror block front wall opening 452, the reflective surface 448 and the bottom wall opening 446. In a similar manner, light emitted from the end 454 of fiber optic cable 436 is also able to impinge upon the active surface 34.

Figure 14:
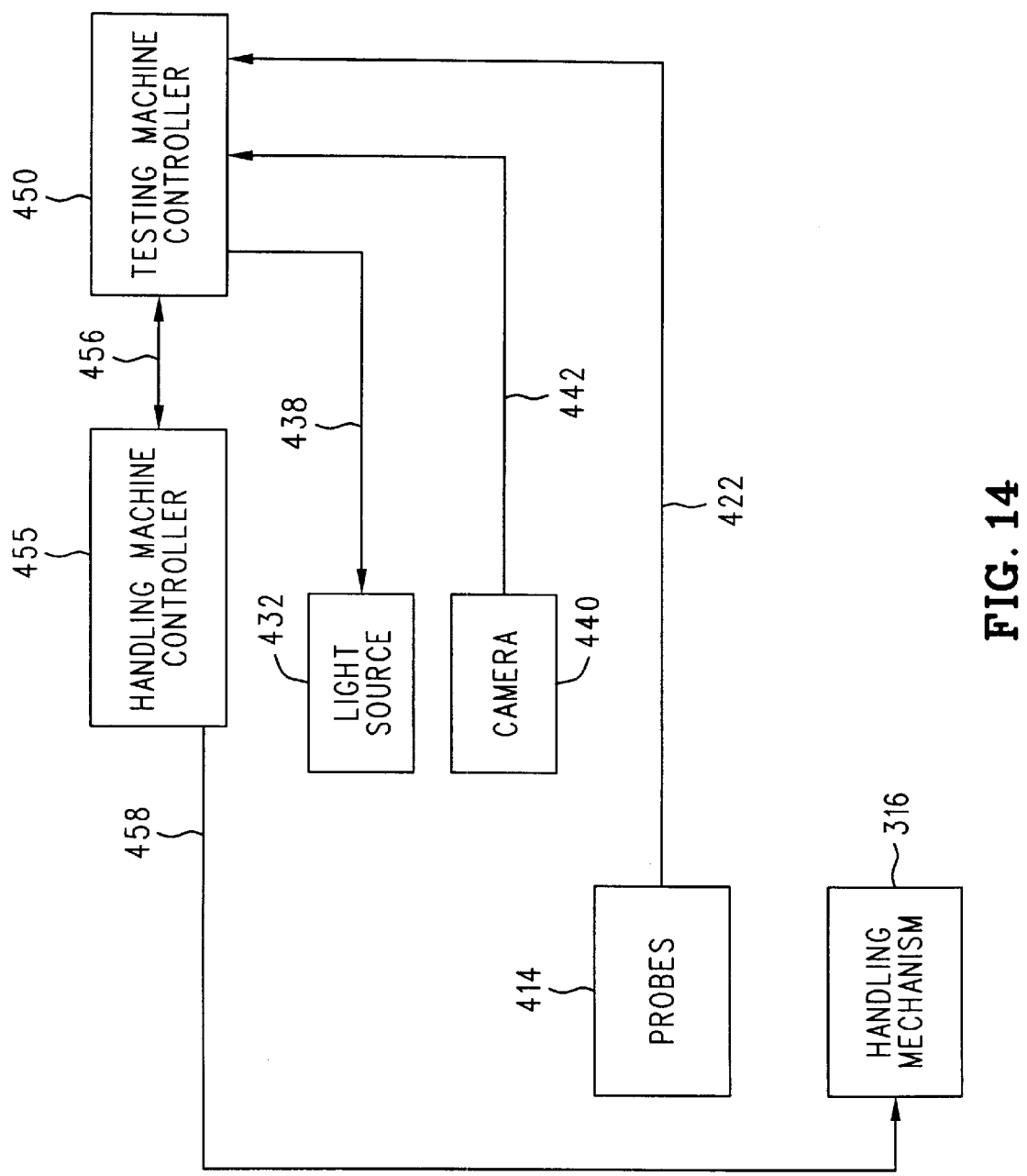
FIG. 14 is a schematic diagram illustrating the operation of the automated wafer integrated circuit test system of FIGS. 12 and 13.

FIG. 14 schematically illustrates the control system for the modified wafer integrated circuit testing system 300. Referring to FIG. 14, a handling machine controller 455 may be connected via a data link 456 to a conventional testing machine controller 450. Testing machine controller 450 may receive a data signal from the camera 440 via the cable 442 previously described. Testing machine controller 450 may also receive data signals from the probes 414 via the cable 422 previously described. The testing machine controller 450 may also be connected to the light source 432 via the cable 438 previously described. The controller 454 may be connected to the handling mechanism 316 via a cable 458 as shown.

In this manner, the controller 454 is able to control the handling mechanism 316 to cause individual wafer integrated circuits to be sequentially aligned with the probes 414 of the test head in a manner as previously described.

The testing machine controller 450 is then able to test image capture chips by selectively activating the light source 432 while monitoring the signals from the probes 414 via the cable 422. The testing machine controller 450 is also able to test display chips by activating light source 432 (if necessary), selectively supplying signals to the probes 414 via the connection 422 and monitoring the image of the integrated circuit active surface 34 captured by the camera 440 via the cable 442.

Except for the addition of camera 440, light source 432, the mirror block 444 and the control scenario depicted in FIG. 14, the test head 410 may be a conventional test head device and may, for example, be of the types commercially available from Hewlett-Packard Company of Palo Alto, Calif. and sold as Tester Model No. HP83000 and Tester Model No. HP94000.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A method of testing an integrated circuit device of the type having a plurality of electrical contact mechanisms thereon using an automated testing system which includes a test head having a plurality of electrical contact members and a handling apparatus for selectively moving said integrated circuit device electrical contact mechanisms into and out of contact with said test head contact members, comprising:

providing a light source associated with said automated testing system;

providing a reflective surface in association with said automated testing system;

moving said integrated circuit device electrical contact mechanisms into contact with said test head contact members;

illuminating said integrated circuit device with said light source while said contact between said integrated circuit device electrical contact mechanisms and said test head contact members is maintained, wherein said illuminating comprises reflecting light from said light source off of said reflective surface;

performing a test of said integrated circuit device during said illuminating; and wherein said providing said light source comprises providing said light source within said handling apparatus.

2. The method claim 1 and further including imaging said integrated circuit device with an imaging device while said contact between said integrated circuit device electrical contact mechanisms and said test head contact members is maintained.

3. The method of claim 1 wherein said integrated circuit device is an integrated circuit package.

4. The method of claim 1 and further including providing a plunger mechanism within said handling apparatus.

5. The method of claim 4 and further including applying pressure to said integrated circuit device with said plunger mechanism while said illuminating is being carried out.

6. The method of claim 5 wherein said reflective surface is attached to said plunger mechanism.

7. A method of testing an integrated circuit device of the type having a plurality of electrical contact mechanisms thereon using an automated testing system which includes a test head having a plurality of electrical contact members and a handling apparatus for selectively moving said integrated circuit device electrical contact mechanisms into and out of contact with said test head contact members, comprising:

providing an imaging device associated with said automated testing system;

providing a reflective surface in association with said automated testing system;

moving said integrated circuit device electrical contact mechanisms into contact with said test head contact members;

imaging at least a portion of said integrated circuit device with said imaging device while said contact between said integrated circuit device electrical contact mechanisms and said test head contact members is maintained, wherein said imaging comprises reflecting light from said integrated circuit device off of said reflective surface;

performing a test of said integrated circuit device during said imaging.

8. The method claim 7 and further including illuminating said integrated circuit device with an illumination device while said contact between said integrated circuit device electrical contact mechanisms and said test heat contact members is maintained.

9. The method of claim 7 wherein said integrated circuit device is a wafer integrated circuit.

10. The method of claim 7 wherein said providing an imaging device comprises providing said imaging device within said test head.

11. The method of claim 7 wherein said integrated circuit device is an integrated circuit package.

12. The method of claim 7 wherein said providing said imaging device comprises providing said imaging device within said handling apparatus.

13. The method of claim 12 and further including providing a plunger mechanism within said handling apparatus.

14. The method of claim 13 and further including applying pressure to said integrated circuit device with said plunger mechanism while said imaging is being carried out.

15. The method of claim 14 wherein said reflective surface is attached to said plunger mechanism.

16. A method of testing an integrated circuit device of the type having a plurality of electrical contact mechanisms thereon using an automated testing system which includes a test head having a plurality of electrical contact members and a handling apparatus for selectively moving said integrated circuit device electrical contact mechanisms into and out of contact with said test head contact members, comprising:

providing a light source associated with said automated testing system;

providing a reflective surface in association with said automated testing system;

moving said integrated circuit device electrical contact mechanisms into contact with said test head contact members;

illuminating said integrated circuit device with said light source while said contact between said integrated circuit device electrical contact mechanisms and said test head contact members is maintained, wherein said illuminating comprises reflecting light from said light source off of said reflective surface;

performing a test of said integrated circuit device during said illuminating; and wherein said providing a light source comprises providing said light source within said test head.

17. The method claim 16 and further including imaging said integrated circuit device with an imaging device while said contact between said integrated circuit device electrical contact mechanisms and said test head contact members is maintained.

18. The method of claim 16 wherein said integrated circuit device is a wafer integrated circuit.

* * * * *